(12) United States Patent
Barnes

(10) Patent No.: US 6,580,628 B2
(45) Date of Patent: Jun. 17, 2003

(54) ASSOCIATIVE MEMORY

(75) Inventor: William Barnes, Bristol (GB)

(73) Assignee: STMicroelectronics Limited, Bristol (GB)

( * ) Notice: Subject to any disclaimer, the term of this patent is extended or adjusted under 35 U.S.C. 154(b) by 0 days.

(21) Appl. No.: 10/176,109

(22) Filed: Jun. 19, 2002

(65) Prior Publication Data

US 2002/0196670 A1 Dec. 26, 2002

(30) Foreign Application Priority Data

Jun. 22, 2001 (EP) ............................. 01305493

(51) Int. Cl.[7] .............................................. G11C 15/00
(52) U.S. Cl. ................. 365/49; 365/189.07; 365/189.08
(58) Field of Search .............................. 365/49, 189.07, 365/189.08

(56) References Cited

U.S. PATENT DOCUMENTS

| | | | |
|---|---|---|---|
| 5,586,288 A | | 12/1996 | Dahlberg |
| 5,638,315 A | * | 6/1997 | Braceras et al. ............... 365/49 |
| 5,859,791 A | | 1/1999 | Schultz et al. |
| 5,999,435 A | * | 12/1999 | Henderson et al. ........... 365/49 |
| 6,081,440 A | | 6/2000 | Washburn et al. |
| 6,161,164 A | * | 12/2000 | Dhong et al. ................ 711/108 |
| 6,175,514 B1 | * | 1/2001 | Henderson et al. ........... 365/49 |
| 6,188,629 B1 | | 2/2001 | Kaplinsky |

OTHER PUBLICATIONS

K. Ghose, "The Architecture of Response–Pipelined Content Addressable Memories", 8205 Microprocessing and Microprogramming 40(1994) Jul., No. 6, Elsevier Science B.V.

T. Moors, et al., University of Western Australia, "Cascading Content–Addressable Memories", © Jun. 1992 IEEE, pp. 56–66.

* cited by examiner

Primary Examiner—Son T. Dinh
(74) Attorney, Agent, or Firm—Hogan & Hartson L.L.P.

(57) ABSTRACT

An associative memory comprises an array of memory cells arranged in rows and columns, each row comprising a plurality of segments each of which comprises a set of said memory cells, wherein each memory cell has compare circuitry for comparing input data with data stored therein and for generating a cell match signal when said input data matches said stored data and match signal combining circuitry for receiving a match signal from a preceding cell in the set and operable to generate a logical value dependent on the match signal of the current cell and the match signal of the preceding cell whereby each segment generates a resultant segment logical value, the memory further comprising combinatorial logic circuitry associated with each row for combining said resultant segment logical values to generate a final output match signal for that row.

21 Claims, 3 Drawing Sheets

ASSOCIATIVE MEMORY

FIELD OF THE INVENTION

The present invention relates to an associative memory of the type commonly known as a CAM.

BACKGROUND OF THE INVENTION

As is well known in the art, such memories comprise an array of memory cells, each holding a data bit, the cells being arranged in rows and columns. Each row normally holds a word, for example of 32 bits. Data can be read and written into a CAM in a manner similar to that for a random access memory (RAM). In addition, a CAM cell has an additional function in that it provides a match signal indicating whether a data word input to the CAM array matches a data word already stored in the array. This function can be used to quickly check the contents of the CAM for a word match, by inputting a data word and generating a match signal for any row of the CAM in which all bits of the data word match the bits stored in memory cells of that row. When the match signal for the row is high, this indicates that the input data word is stored in the CAM array.

To perform this function, each CAM cell generates a local or cell match signal which indicates if data input to the cell matches the data already stored in the cell. In order to determine whether or not a complete word is matched, these local match signals need to be somehow combined to generate a match signal for a row. It will readily be appreciated, that as soon as one of the cells fails to match, the match signal for the row is low.

FIG. 1 illustrates output circuitry for a CAM row which represents one known way of generating the match signal for a row. It is assumed herein that there are 32 cells in each row of the CAM, representing a 32 bit word to be matched. Each cell of the row is associated with a respective drive output transistor $2_0, 2_1 \ldots 2_{32}$ which receives at its gate the local match signal $m_0, m_1 \ldots m_{32}$. A precharge transistor 4 receives an active low precharge signal PC at its gate for precharging. Holding circuitry 6 serves to assist in holding the match signal high, in a manner which is known in the art.

SUMMARY OF THE INVENTION

According to this arrangement, the match outputs $m_0, m_1 \ldots m_{32}$ drive the output transistors $2_0, 2_1 \ldots 2_{32}$ in parallel. If any one of the local match signals is low, the output signal MATCH at a so-called common node 8 will be caused to fall.

A disadvantage of this arrangement is that it requires precharge and hold circuitry as represented by transistor 4 and holding circuitry 6, the precharge transistor 4 being required to precharge the common node 8 high in between each match cycle. The precharge logic requires timing analysis etc., which makes it potentially complex to operate.

According to an alternative known arrangement, the cell match signals are supplied in pairs to respective AND gates. The outputs of these AND gates are likewise supplied in pairs to a subsequent logic stage of AND gates. Thus, the match signals are combined in pairs to generate a final logical value for the match signal for each row. For a row of 32 bits, six stages of logic gates are required. Although this overcomes the problems associated with the need for precharge circuitry, the distance between the stages is large, requiring large drive transistors to encompass the distances. However, it is frequently the case that the drive transistors are not utilised, for the simple reason that many of the match outputs will be zero. Thus, this design is inherently redundant.

It is an aim of the present invention to provide an associative memory in which the match cell is generated in an easier and more efficient manner.

According to the present invention there is provided an associative memory comprising an array of memory cells arranged in rows and columns, each row comprising a plurality of segments each of which comprises a set of said memory cells, wherein each memory cell has compare circuitry for comparing input data with data stored therein and for generating a cell match signal when said input data matches said stored data and match signal combining circuitry for receiving a match signal from a preceding cell in the set and operable to generate a logical value dependent on the match signal of the current cell and the match signal of the preceding cell whereby each segment generates a resultant segment logical value, the memory further comprising combinatorial logic circuitry associated with each row for combining said resultant segment logical values to generate a final output match signal for that row.

For a better understanding of the present invention and to show how the same may be carried into effect, reference will now be made by way of example to the accompanying drawings, in which:

DESCRIPTION OF PREFERRED EMBODIMENTS OF THE INVENTION

Figure 1:
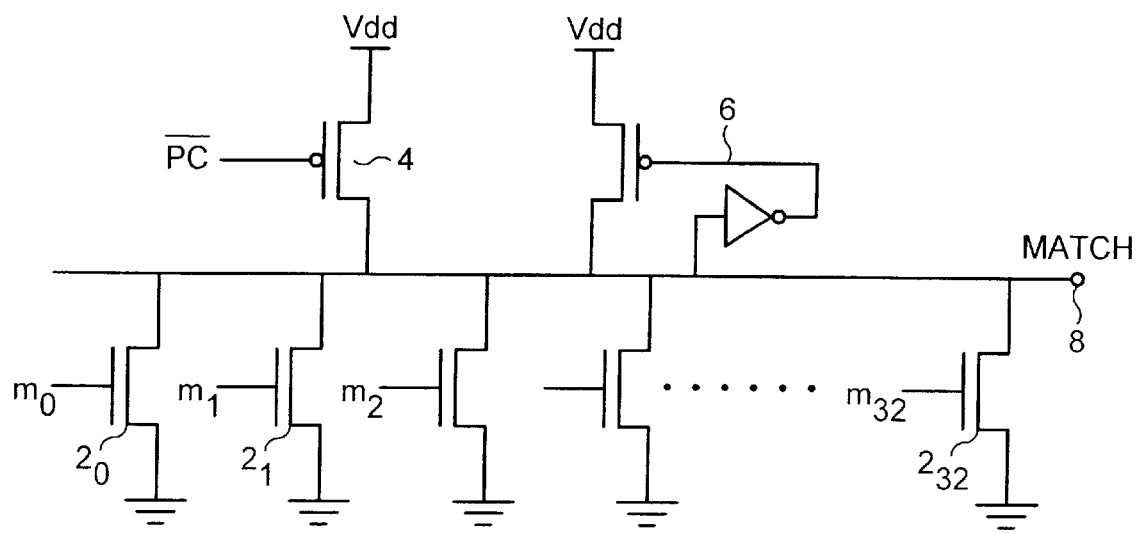
FIG. 1 represents a known output stage for a CAM.
Figure 2:
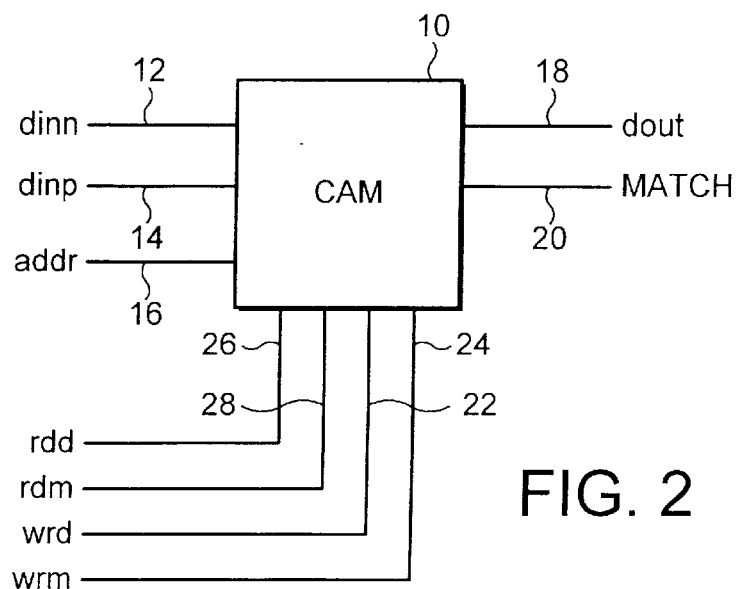
FIG. 2 is a schematic block diagram of the inputs and outputs to a CAM.

FIG. 2 is a schematic block diagram of a CAM array 10 illustrating its inputs and outputs. The CAM array discussed herein stores in each CAM cell a data bit and a mask bit. It will readily be appreciated however that the invention could also be applied in a more simple context where only a single data bit is stored in each cell, that is with no mask bit. To store the data bit and mask bit, two data inputs dinn (data_negative), dinp (data_positive) 12, 14 are used. This represents the data (dinp) and its inverse (dinn) for each cell. The memory is addressed in a conventional way along address line addr, 16. Data is output from the CAM array 10 along a data output line dout, 18. A match signal output MATCH is generated on line 20. The CAM array is written using write data and write mask lines wrd, wrm 22, 24. The array can be read using read data and read mask signals rdd, rdm 26, 28. At the block level, the signals input and output from the CAM array 10 are conventional and are therefore only discussed further to the extent that they are required in an understanding of the present invention.

The CAM array 10 itself comprises a plurality of CAM cells arranged in rows and columns. According to the described embodiments of the invention, each row of the CAM is organised into segments as will now be described in the following.

Figure 3:
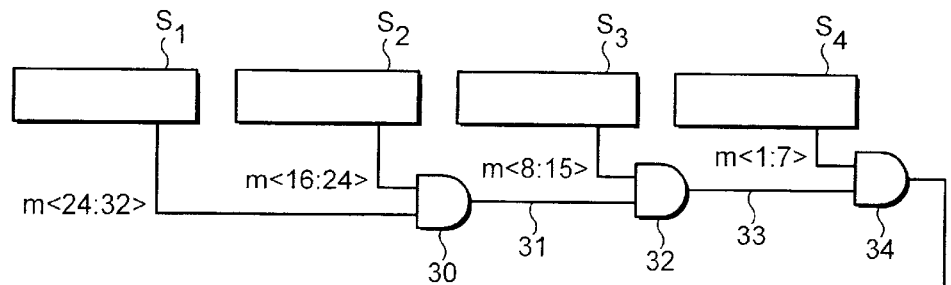
FIG. 3 illustrates a segmented row of a CAM according to one embodiment of the invention.

According to a first embodiment of the invention illustrated in FIG. 3, each row of a 32 bit word CAM is divided into four segments $S_1, S_2, S_3, S_4$. Each segment comprises eight CAM cells as will be described more fully in the following. Each segment generates a byte match signal which is indicative of the local match signals generated in the cells of that segment. The match signal for the low end segment $S_4$ is labelled m<1:7> to indicate that it represents the match signal which takes into account the logical values of the match signals for each of cells 1 to 7 which are located in the segment $S_4$. The match signals for the remaining segments are similarly labelled. Combinatorial logic for combining the byte match signals comprises three AND gates 30, 32, 34. The byte match signals for segments $S_1$, $S_2$ are supplied to a first AND gate 30. A second AND gate 32 receives the output byte match signal m<8:15> for the third segment $S_3$ and also the output 31 of the first AND gate 30. A third AND gate 34 receives the byte match signal m<1:7> of the fourth segment $S_4$ and the output 33 of the second AND gate. The third AND gate 34 generates the final output match signal MATCH for that CAM row.

Figure 4:
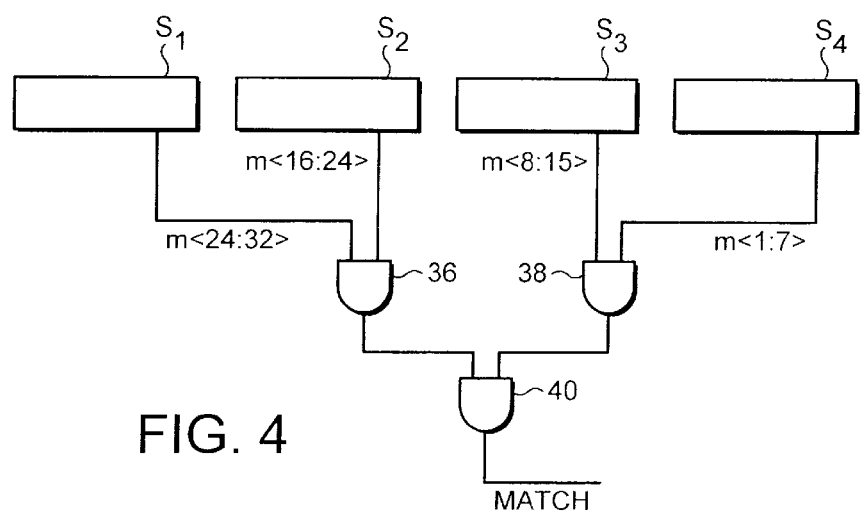
FIG. 4 illustrates a segmented row of a CAM according to another embodiment of the invention.

According to a second embodiment of the invention illustrated in FIG. 4, each row of the CAM array is likewise divided into four segments each of eight cells. Match signals for each segment are generated as described above with reference to FIG. 3. The embodiment of FIG. 4 differs from that of FIG. 3 in the layout of the combinatorial logic circuitry used to combine the segment match signals. The byte match signals m<24:32>, m<16:24> of the first and second segments $S_1$, $S_4$ are supplied to a first AND gate 36. The byte match signals m<8:15>, m<1:7> of the third and fourth segments $S_3$, $S_4$ are supplied to a second AND gate 38. The outputs of the first and second AND gates 36, 38 feed a third AND gate 40 which generates the final match signal MATCH for the row.

Figure 5:
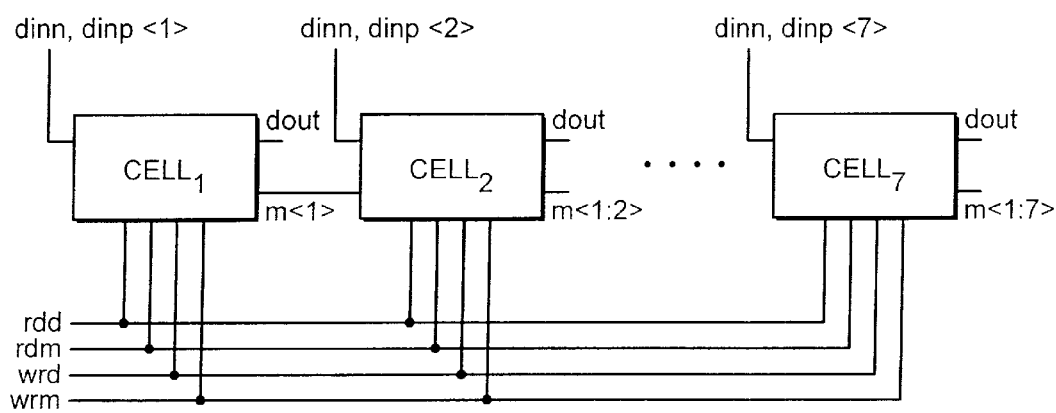
FIG. 5 illustrates the cell layout of each segment.

FIG. 5 illustrates the cell construction for each segment $S_1$ to $S_4$ of the embodiment of FIGS. 3 and 4. Each segment comprises eight cells, $CELL_1$, $CELL_2$ ... $CELL_7$. Each cell receives the read and write inputs rdd, rdm, wrd, wrm for reading and writing to the cell as mentioned above in connection with FIG. 2. In addition, each cell receives data inputs dinn, dinp local to that cell as represented by the cell index in diagonal brackets, for example dinn, dinp <1> denoting the input for cell 1. The first cell in each segment generates a match signal m<1> which indicates whether data input to the cell dinp matches data already stored in the cell. If there is a match, the local match signal m<1> has a logical value of one, and if there is no match the match signal m<1> has logical value of zero.

That local match signal is supplied to the subsequent cell, cell 2, in the segment. That cell has circuitry for comparing data input to the cell dinp <2> with data stored in it, and also for taking into account the match signal m<1> generated by the preceding cell. It generates a local match signal m<1:2> which has a logical high value only if the data input to the second cell, cell 2, matches the data stored therein and the incoming match signal m<1> from the preceding cell is high. Successive cells in the segment are connected in the same way, with the result that the segment or byte match signal generated by cell 7 m<1:7> is high only if there has been a match in all of the preceding cells.

Figure 6:
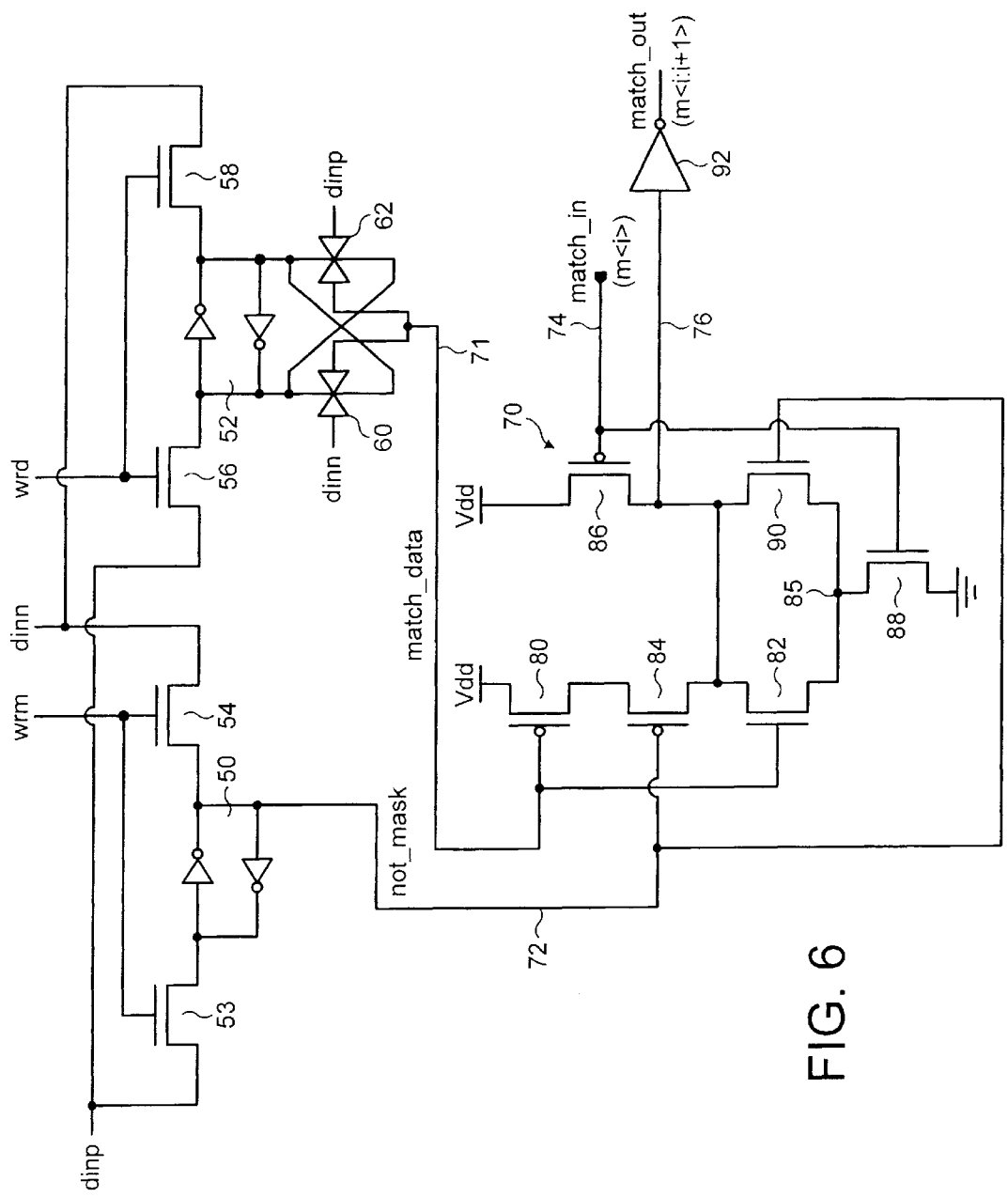
FIG. 6 illustrates the transistor layout of a CAM cell.

FIG. 6 illustrates circuitry in each of the CAM cells within a segment. Each cell comprises a mask storage portion 50 and a data storage portion 52. The mask storage portion 50 is associated with mask write transistors 53, 54 which are driven respectively by the write mask signal wrm. Data dinp and its inverse dinn are supplied respectively to the write transistors 53, 54.

The data storage portion 52 is similarly associated with data write transistors 56, 58. The data write transistors 56, 58 are controlled by the data write signal wrd. The data inputs dinp, dinn are supplied respectively to the data write transistors in the inverse manner to that in which they are supplied to write the mask storage portion 50. The data storage portion 52 is connected to pass gates 60, 62 each of which receive data dinp and its inverse dinn for matching purposes. The pass gates 60, 62 implement an exclusive OR function which constitutes a comparison. If the data input at the data terminal dinn matches the data stored in the data storage portion 52 of the cell, a match_data signal is set high. If there is no match, the match_data signal is set low.

Each cell also comprises logic circuitry denoted generally by reference numeral 70. The logic circuitry receives the match_data signal 71 from the pass gates 60, 62, the inverse a mask signal not_mask on line 72 from the mask storage portion 50 and a match_in signal which is the local match signal from the preceding cell, denoted m<i> in this case. It will be understood that the cell illustrated in FIG. 6 in that case is therefore $CELL_{i+1}$. The combinatorial logic circuit 70 comprises a first p-channel transistor 80 connected in series between the supply voltage Vdd and a common node 85 with a second n-channel transistor 82 for receiving the match_data signal 71. A third p-channel transistor 84 is connected between the first and second transistors 80, 82 and receives at its input the inverse mask signal not_mask 72.

The match_in signal 74 is supplied to the input of a p-channel transistor 86 connected between the supply voltage V and an output match line 76. The match_in signal 74 is also supplied to an n-channel transistor 88 connected between the common node 85 and ground. The not_mask signal 72 is also supplied to the gate of an n-channel transistor 90 connected in series between the common node 85 and the p-channel transistor 86 which receives the match_in signal 74. The output match line 76 is connected to an inverter 92 which generates the local match signal match_out.

The transistor 86 which receives the match_in signal 74 ensures that the local match signal match_out is low if the input match signal match_in from the preceding cell is low. If the input match signal match_in is low, the p-channel transistor 86 is turned on, allowing the output line 76 to be pulled to the supply voltage V and thus to a high logical value. The inverter 92 thus sets the output match signal match_out to a low logical value in these circumstances.

If the input match signal match_in 74 is high, however, the p-channel transistor 86 is turned off but the n-channel transistor 88 is turned on, allowing the common node 85 to be pulled towards ground. If the match_data signal 71 is also high (indicating a match between the input data dinp and the data stored in the data storage portion 52 of the cell), then the n-channel transistor 82 is turned on which allows the output line 76 to be pulled low. This in turn causes the output match signal match_out to have a high logical value, thereby indicating a match.

Similarly, if the not_mask signal 72 is high, the transistor 90 is turned on, which likewise causes the output line 76 to be pulled low and thus generates a high match_out signal.

In this way, combinatorial logic circuit 70 has the following logical result:

match_out=match_in AND ((din=data) OR not_mask)), where din represents the positive input data to the cell during a match cycle and data represents the data stored in the data storage portion 52 of the cell.

It will be appreciated that the cell also matches if mask=0.

The CAM design described above has the advantage that it reduces the delay in generating a match signal, but yet does not introduce too many logical stages. Although the overall CAM array layout is increased, the fundamental cell construction can be small because the drive transistor is only ever required to drive its nearest neighbour in terms of the local match signal generated by it. Thus, the combination of reduced transistor size in each CAM cell, and a small number of logical stages of AND gates provides a significant advantage over earlier designs.

What is claimed is:

1. An associative memory comprising an array of memory cells arranged in rows and columns, each row comprising a plurality of segments each of which comprises a set of said memory cells, wherein each memory cell has compare circuitry for comparing input data with data stored therein and for generating a cell match signal when said input data matches said stored data and match signal combining circuitry for receiving a match signal from a preceding cell in the set and operable to generate a logical value dependent on the match signal of the current cell and the match signal of the preceding cell whereby each segment generates a resultant segment logical value, the memory further comprising combinatorial logic circuitry associated with each row for combining said resultant segment logical values to generate a final output match signal for that row.

2. An associative memory according to claim 1, wherein the match signal combining circuitry of each cell comprises an AND gate.

3. An associative memory according to claim 1, wherein the combinatorial logic circuitry comprises a first two input AND gate for receiving the resultant segment logical values of a first pair of said segments.

4. An associative memory according to claim 3, wherein the combinatorial logic circuitry comprises a second AND gate for receiving the resultant segment logical values of a second pair of said segments and a third AND gate for combining the outputs of the first and second AND gates to generate the final output match signal.

5. An associative memory according to claim 3, which comprises a second AND gate for receiving the output of the first AND gate and the resultant segment logical value from the third segment and a third AND gate for receiving the output of the second AND gate and the resultant segment logical value from a fourth segment to generate the final output match signal.

6. An associative memory according to claim 1, wherein each row comprises 32 cells arranged in four segments of eight cells each.

7. An associative memory according to claim 1, wherein each cell comprises respective storage portions for holding a data bit and a mask bit.

8. An associative memory according to claim 1, wherein the compare circuitry comprises an exclusive OR function circuit.

9. An associative memory comprising:
a current memory cell that includes a match signal combining circuit, wherein the match signal combining circuit provides a logical value that is derived by comparing a current match signal from the current memory cell with a previous match signal from a previous memory cell, and wherein said previous match signal is generated prior to said current match signal.

10. An associative memory comprising:
a memory row that includes two or more memory segments, wherein each of the memory segments includes two or more memory cells and each of the memory cells includes a match signal combining circuit to provide a memory cell logical value that is derived by comparing a match signal from the memory cell with a previous match signal from a previous memory cell,
a segment logical value circuit associated with each of said memory segments that provides a segment logical value derived from the memory cell logical value; and
a combinatorial logic circuit associated with the memory row that provides a final output match signal by a comparison of the segment logical values.

11. The associative memory of claim 10, wherein the match signal combining circuit comprises an AND gate.

12. The associative memory of claim 10, wherein said memory row comprises a first pair of memory segments, including a first segment and a second segment, and a second pair of memory segments, including a third segment and a fourth segment, and
said combinatorial logic circuit comprises a first AND gate to receive the segment logical values from said first pair of memory segments in order to produce a first resultant segment logical value.

13. The associative memory of claim 12, wherein said combinatorial logic circuit comprises:
a second AND gate to receive the first resultant segment logical value and the segment logical value of the third segment in order to produce a second resultant segment logical value; and
a third AND gate to receive the second resultant segment logical value and the segment logical value of the fourth segment in order to produce the final output match signal.

14. The associative memory of claim 12, wherein said combinatorial logic circuit comprises:
a second AND gate to receive the segment logical values from said second pair of memory segments in order to produce a second resultant segment logical value; and
a third AND gate to receive the first and second resultant segment logical values in order to produce said final output match signal.

15. The associative memory of claim 10, wherein each of said memory cells comprises a read and write line, a data line, an address line and a match line.

16. The associative memory of claim 15, wherein said read and write line is selected from the group consisting of a read data (rdd) input, read mask (rdm) input, write data (wrd) input, and write mask (wrm) input.

17. The associative memory of claim 15, wherein said data line is selected from the group consisting of a data negative input (dinn), data positive input (dinp), and data output (dout).

18. The associative memory of claim 10, wherein the memory cells each have a portion of memory storage for a data bit and a portion of memory storage for a mask bit.

19. A method of comparing in put data with stored data in an associative memory comprising:
providing an array of memory cells arranged in memory rows where each row is divided into two or more memory segments;
comparing a first input data bit with a first stored data bit in a first memory cell in order to generate a first cell match signal;
comparing a second input data bit with a second stored data bit in a second memory cell in order to generate a second cell match signal;
comparing said first cell match signal and said second cell match signal in a first match signal combining circuit in order to generate a first logical value;

comparing a third input data bit with a third stored data bit in a third memory cell in order to generate a third cell match signal; and comparing said third cell match signal with said first logical value in a second match signal combining circuit in order to generate a second logical value.

20. The method of claim 19, wherein the first match signal combining circuit is part of the second memory cell.

21. The method of claim 20, wherein the second match signal combining circuit is part of the third memory cell.

* * * * *

UNITED STATES PATENT AND TRADEMARK OFFICE
CERTIFICATE OF CORRECTION

PATENT NO.    : 6,580,628 B2
DATED         : June 17, 2003
INVENTOR(S)   : William Barnes It is certified that error appears in the above-identified patent and that said Letters Patent is hereby corrected as shown below:

<u>Title page,</u>
Item [63], Related U.S. Application Data, should be inserted to read as follows:
-- [30]   Foreign Application Priority Data
   Jun. 22, 2001  (EP) ..........................01305439 --

Signed and Sealed this

Twenty-third Day of September, 2003

JAMES E. ROGAN
*Director of the United States Patent and Trademark Office*